(12) United States Patent
Riepen et al.

(10) Patent No.: US 8,804,094 B2
(45) Date of Patent: Aug. 12, 2014

(54) LITHOGRAPHIC APPARATUS AND A DEVICE MANUFACTURING METHOD

(75) Inventors: Michel Riepen, Veldhoven (NL); Nicolaas Rudolf Kemper, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 561 days.

(21) Appl. No.: 13/024,364

(22) Filed: Feb. 10, 2011

(65) Prior Publication Data

US 2011/0199593 A1 Aug. 18, 2011

Related U.S. Application Data

(60) Provisional application No. 61/304,150, filed on Feb. 12, 2010, provisional application No. 61/323,556, filed on Apr. 13, 2010.

(51) Int. Cl.
*G03B 27/52* (2006.01)

(52) U.S. Cl.
USPC .............................................. 355/30; 355/53

(58) Field of Classification Search
CPC ... G03F 7/70341; G03F 7/707; G03F 7/2041; B01L 2300/089
USPC .................................................... 355/30, 53
See application file for complete search history.

(56) References Cited

U.S. PATENT DOCUMENTS

| | | | |
|---|---|---|---|
| 4,509,852 A | 4/1985 | Tabarelli et al. | |
| 2004/0136494 A1 | 7/2004 | Lof et al. | |
| 2004/0207824 A1 | 10/2004 | Lof et al. | |
| 2006/0038968 A1 | 2/2006 | Kemper et al. | |
| 2006/0119809 A1 | 6/2006 | Verhagen et al. | |
| 2006/0250593 A1 | 11/2006 | Nishii | |
| 2006/0261288 A1 | 11/2006 | Van Santen | |
| 2007/0091289 A1 | 4/2007 | Poon et al. | |
| 2007/0252964 A1 | 11/2007 | Kohno et al. | |
| 2008/0212046 A1 | 9/2008 | Riepen et al. | |
| 2009/0279060 A1 | 11/2009 | Direcks et al. | |
| 2009/0279062 A1 | 11/2009 | Direcks et al. | |
| 2009/0279063 A1* | 11/2009 | Riepen et al. | .................... 355/30 |
| 2010/0313974 A1 | 12/2010 | Riepen et al. | |

FOREIGN PATENT DOCUMENTS

| | | |
|---|---|---|
| CN | 10-1021693 | 8/2007 |
| CN | 10-1403862 | 4/2009 |
| CN | 10-1515118 | 8/2009 |
| EP | 1420300 | 5/2004 |
| JP | 2007-005363 | 1/2007 |
| JP | 2008-288589 | 11/2008 |
| JP | 2009-188060 | 8/2009 |
| JP | 2009-272640 | 11/2009 |
| WO | 99/49504 | 9/1999 |
| WO | 2005/064405 | 7/2005 |

OTHER PUBLICATIONS

U.S. Appl. No. 61/266,058, filed Dec. 2, 2009, Michel Riepen et al.

\* cited by examiner

*Primary Examiner* — Steven H Whitesell Gordon
*Assistant Examiner* — Mesfin T Asfaw
(74) *Attorney, Agent, or Firm* — Pillsbury Winthrop Shaw Pittman LLP (57) ABSTRACT

A meniscus pinning device has a plurality of openings through which liquid and gas from the environment are extracted. The openings are of an intermediate size, having a maximum cross-sectional dimension (e.g., diameter) in the range of from about 75 μm to about 150 μm.

22 Claims, 6 Drawing Sheets

LITHOGRAPHIC APPARATUS AND A DEVICE MANUFACTURING METHOD

This application claims priority and benefit under 35 U.S.C. §119(e) to U.S. Provisional Patent Application Ser. No. 61/304,150, entitled "Lithographic Apparatus and A Device Manufacturing Method", filed on Feb. 12, 2010, and to U.S. Provisional Patent Application Ser. No. 61/323,556, entitled "Lithographic Apparatus and A Device Manufacturing Method", filed on Apr. 13, 2010. The contents of those applications are incorporated herein in their entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

After exposure of a substrate in an immersion lithographic apparatus, the substrate table is moved away from its exposure position to a position in which the substrate may be removed and replaced by a different substrate. This is known as substrate swap. In a two stage lithographic apparatus, for example ASML's "Twinscan" lithographic apparatus, the substrate tables swap takes place under the projection system.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example, U.S. Pat. No. 4,509,852) is a form of immersion system arrangement. The arrangement requires that a large body of liquid should be accelerated during a scanning exposure. This may require additional or more powerful motors and turbulence in the liquid may lead to undesirable and unpredictable effects.

Another arrangement proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. This type of arrangement may be referred to as a localized immersion system arrangement.

PCT patent application publication WO 2005/064405 discloses another type of immersion system arrangement referred to the all wet arrangement in which the immersion liquid is unconfined. In such a system the whole top surface of the substrate is covered in liquid. This may be advantageous because then the whole top surface of the substrate is exposed to the substantially same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in United States patent application publication no. US 2006/0119809. A member is provided which covers the substrate W in all positions and which is arranged to have immersion liquid extending between it and the top surface of the substrate and/or substrate table which holds the substrate.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. The fluid handling system is located between the projection system and the substrate table. In reference to the aforementioned description, reference in this paragraph to a feature defined with respect to fluid may be understood to include a feature defined with respect to liquid.

In a fluid handling system or liquid confinement structure, liquid is confined to a space i.e. in an immersion space. For example within a confinement structure the liquid is confined by the body of the structure, the surface of the projection system and the underlying surface (or facing surface, e.g. a substrate table, a substrate supported on the substrate table, a shutter member and/or a measurement table). In the case of a localized area immersion system, the liquid is also confined in the immersion space by a liquid meniscus between the fluid handling system or liquid confinement structure and the underlying structure. In the case of an all wet system, liquid is allowed to flow out of the immersion space onto the top surface of the substrate and/or substrate table.

SUMMARY

It is desirable, for example, to provide a lithographic apparatus in which bubbles are prevented from entering the projection beam during imaging.

In an aspect of an invention, there is provided a lithographic apparatus comprising: table configured to hold a substrate; a projection system configured to project an image onto the substrate while the table and the projection system are moved relative to each other; and a liquid confinement structure arranged to confine a liquid to a space between the projection system and the substrate and/or table, the liquid confinement structure having a meniscus pinning device arranged to pin a meniscus of the liquid, the meniscus pinning device comprising a plurality of openings arranged in use to be connected to an under-pressure, the openings having a maximum cross-sectional dimension in the range of from 50 µm to 300 µm.

In an aspect of an invention, there is provided a device manufacturing method using a lithographic apparatus, the method comprising: confining a body of liquid to a space in contact with the surface of a substrate; projecting an image onto the substrate through the body of liquid whilst moving the substrate in a scanning direction; wherein confining the body of liquid comprises pinning a meniscus of the body of liquid by extracting liquid and gas from the environment through a plurality of openings, the openings having a diameter in the range of from 50 µm to 300 µm.

In an aspect of an invention, there is provided a fluid handling structure for an immersion lithographic apparatus, the fluid handling structure comprising a two dimensional pattern of two phase fluid extraction openings configured to pin a meniscus of immersion liquid confined to a space, wherein the meniscus is pinned to a pinning opening in a linear array of openings of the two dimensional pattern substantially perpendicular to the meniscus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
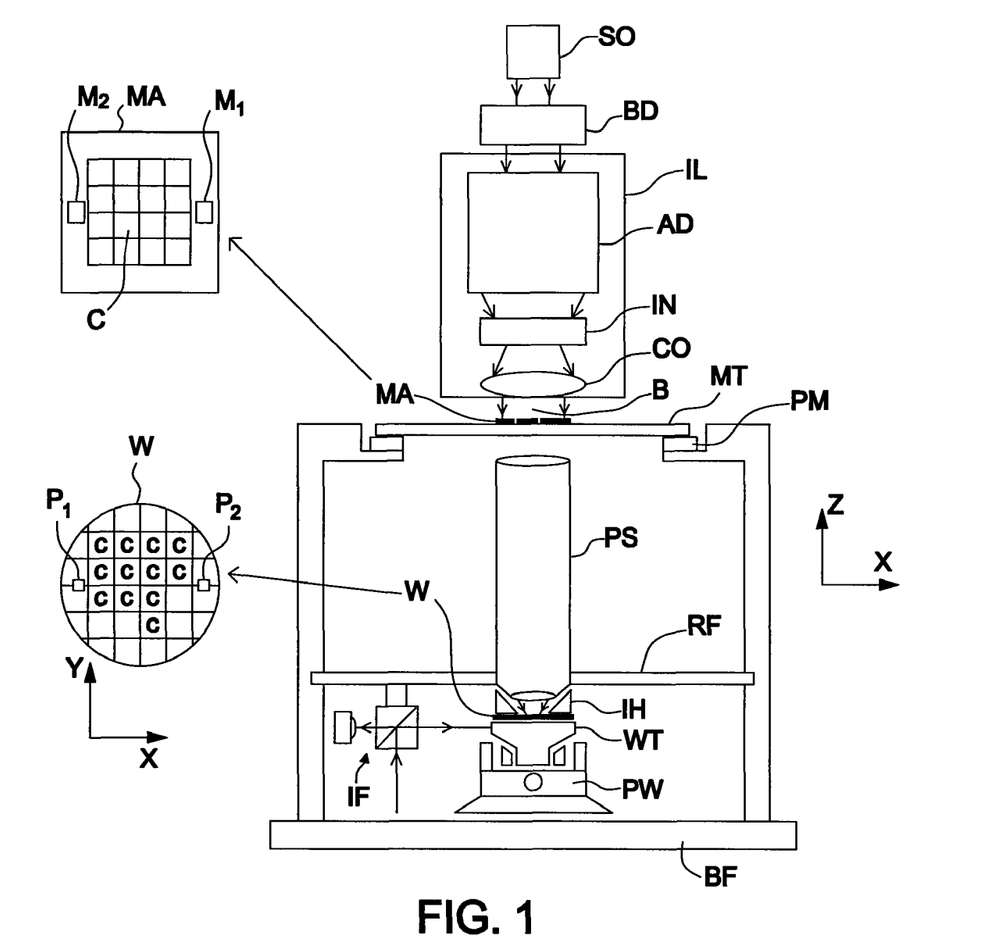
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a table such as a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as desired. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system. The types of projection system may include: refractive, reflective, catadioptric, magnetic, electromagnetic and electrostatic optical systems, or any combination thereof. The selection or combination of the projection system is as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual) or more stages, one of which is a substrate stage to support a substrate. In an embodiment another of the stages is a measurement table supporting a sensor for the projection system, a cleaning device or both. Such a "multiple stage" machine may have two or more patterning device tables. In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS. The projection system PS focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as desired after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

An arrangement to provide liquid between a final element of the projection system PS and the substrate is the so called localized immersion system IH. In this system a fluid handling structure is used in which liquid is only provided to a localized area of the substrate. The space filled by liquid is smaller in plan than the top surface of the substrate and the area filled with liquid remains substantially stationary relative to the projection system PS while the substrate W moves underneath that area. Four different types of fluid handling structure are illustrated in FIGS. 2-5.

Figure 2:
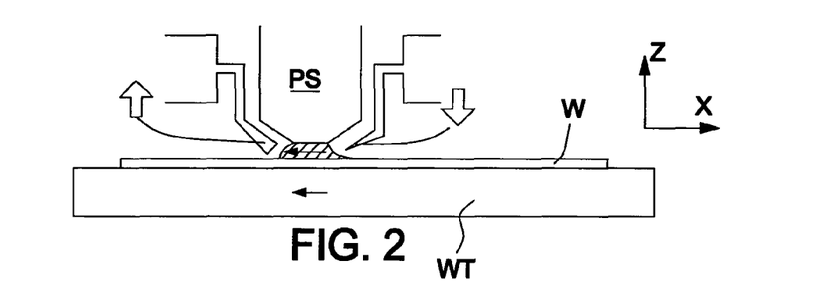
FIGS. 2 and 3 depict a fluid handling structure as a liquid supply system for use in a lithographic projection apparatus.
Figure 3:
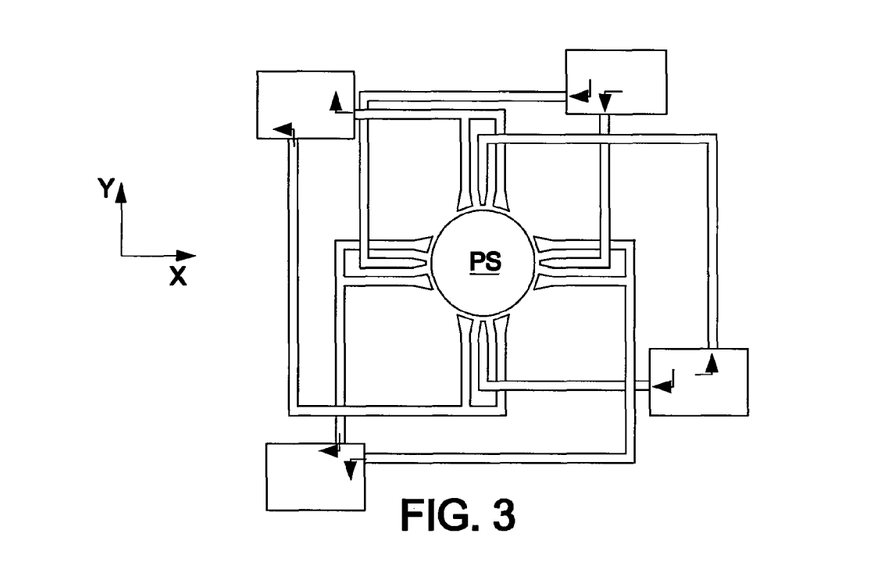

As illustrated in FIGS. 2 and 3, liquid is supplied by at least one inlet onto the substrate, preferably along the direction of movement of the substrate relative to the final element. Liquid is removed by at least one outlet after having passed under the projection system. That is, as the substrate is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Figure 4:
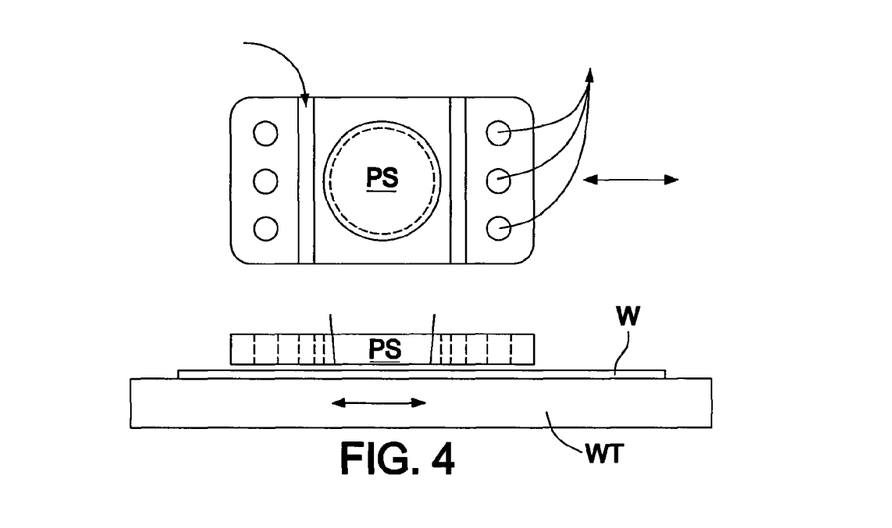
FIG. 4 depicts a further liquid supply system for use in a lithographic projection apparatus.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets can be arranged in a plate with a hole in its centre and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive).

Another arrangement which has been proposed is to provide the liquid supply system with a liquid confinement member which extends along at least a part of a boundary of the space between the final element of the projection system and the substrate table. Such an arrangement is illustrated in FIG. 5.

Figure 5:
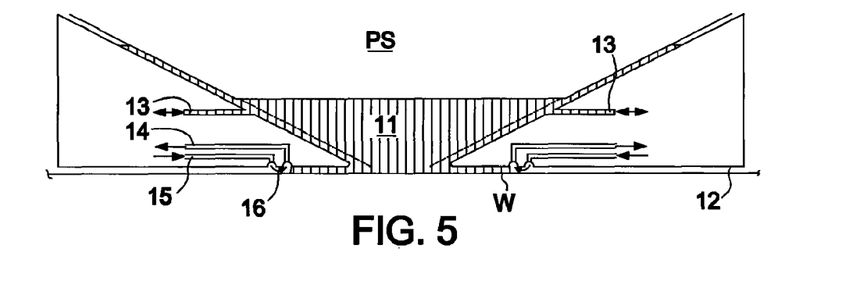
FIG. 5 depicts, in cross-section, a fluid handling structure.

FIG. 5 schematically depicts a localized liquid supply system with a fluid handling structure 12. The fluid handling structure 12 extends along at least a part of a boundary of the space 11 between the final element of the projection system PS and a facing surface which is desirably a substantially flat surface, e.g. the substrate table WT and/or the substrate W. (Please note that reference in the following text to surface of the substrate W also refers in addition or in the alternative to a surface of the substrate table WT, unless expressly stated otherwise.) The fluid handling structure 12 is substantially stationary relative to the projection system PS in the XY plane though there may be some relative movement in the Z direction (in the direction of the optical axis). In an embodiment, a seal is formed between the fluid handling structure 12 and the surface of the substrate W and may be a contactless seal such as fluid seal, desirably a gas seal. Such a system is disclosed in United States patent application publication no. US 2004-0207824, hereby incorporated in its entirety by reference.

The fluid handling structure 12 at least partly contains liquid in the immersion space 11 between a final element of the projection system PS and the substrate W. A contactless seal 16 to the substrate W may be formed in an undersurface of the fluid handling structure 12 around the image field 130 of the projection system PS so that liquid is confined within the space 11 between the substrate W surface and the final element of the projection system PS. Desirably the undersurface is substantially parallel to the facing surface. The immersion space 11 is at least partly formed by the fluid handling structure 12 positioned below and surrounding the final element of the projection system PS. Liquid is brought into the space 11 below the projection system PS and within the fluid handling structure 12 by liquid inlet 13. The liquid may be removed by liquid outlet 13. The fluid handling structure 12 may extend a little above the final element of the projection system PS. The liquid level rises above the final element so that a buffer of liquid is provided. In an embodiment, the fluid handling structure 12 has an inner periphery that at the upper end closely conforms to the shape of the projection system PS or the final element thereof and may, e.g., be round. At the bottom, the inner periphery defined by an edge 20 of the undersurface closely conform to the shape of the image field, e.g., rectangular, though this need not be the case. The undersurface has an outer edge or rim.

The gas seal 16 is formed by gas, e.g. air or synthetic air but, in an embodiment, $N_2$ or another inert gas. The gas in the gas seal 16 is provided under pressure via inlet 15 to the gap between fluid handling structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid handling structure 12 and the substrate W contains the liquid in an immersion space 11. The inlets/outlets may be annular grooves which surround the space 11. The annular grooves may be continuous or discontinuous. The flow of gas is effective to contain the liquid in the space 11. Such a system is disclosed in United States patent application publication no. US 2004-0207824.

Figure 6:
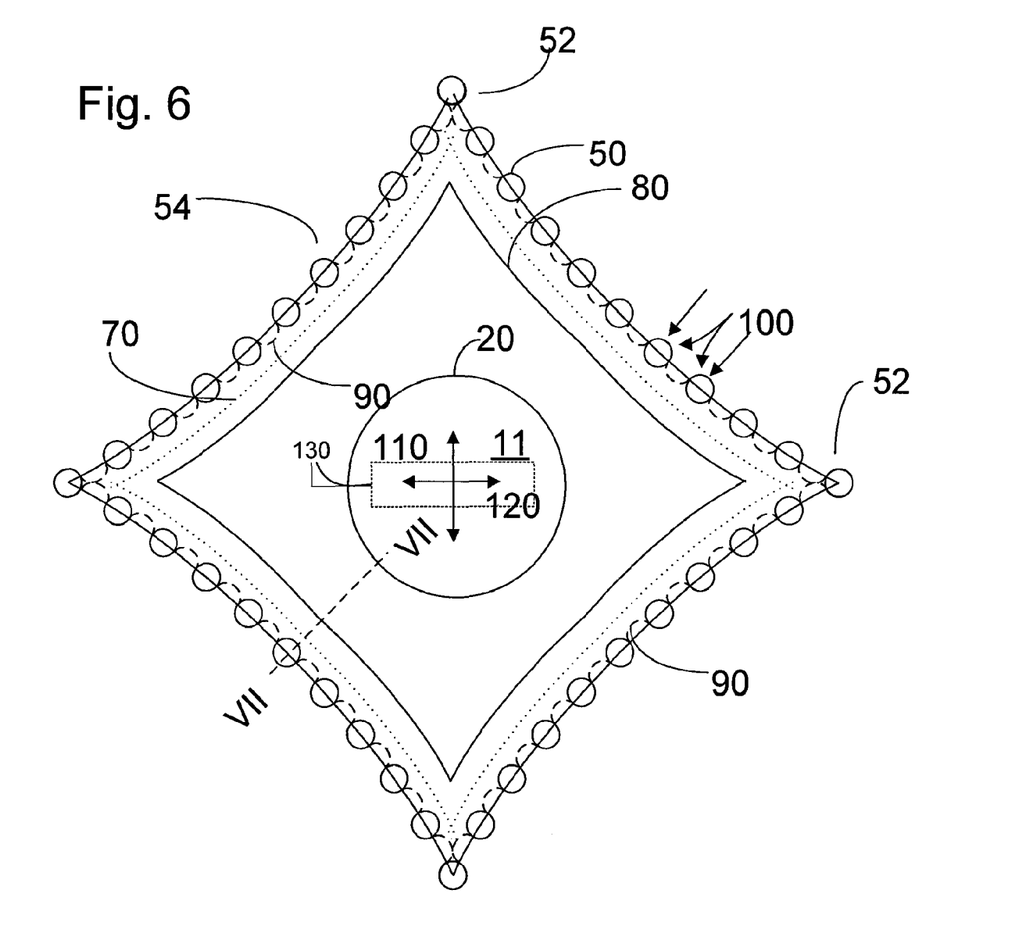
FIG. 6 depicts, in plan, a fluid handling structure according to an embodiment of the invention.

FIG. 6 illustrates a meniscus pinning device of an embodiment of the present invention which may, for example, replace the seal arrangement 14, 15, 16 of FIG. 5. The meniscus pinning device of FIG. 6 comprises a plurality of discrete (extraction) openings 50. Each opening 50 is illustrated as being circular though this is not necessarily the case. Indeed the shape of one or more of the openings 50 may be one or more selected from a square, a circle, a rectilinear shape, a rectangle, an oblong, a triangle, an elongate shape such as a slit, etc. Each opening 50 has, in plan, a large maximum cross-sectional dimension, such as a diameter, perhaps with a maximum dimension in a range of from about 50 μm to about 300 μm, desirably from about 75 μm to about 150 μm, desirably from about 100 μm to about 125 μm.

Desirably, several lines of openings 50 are provided. Such lines of openings 50 can form concentric rings, squares or other shapes. The pitch (center to center spacing) of the openings 50 may be in the range of from about 100 µm to 500 µm, desirably from about 200 µm to about 300 µm. If several lines of openings are provided, the different lines can have different pitches. The openings in adjacent lines, if several lines are provided, are desirably offset relative to one another. In an embodiment, the number of lines of openings is in the range of from 1 to 10, desirably in the range of from 3 to 5.

In an embodiment, the openings are arranged on a spiral line. The spiral line makes more than one turn about its origin, desirably between 3 and 5 turns. The origin of the spiral line lies within the space occupied by the immersion liquid. Desirably the origin of the spiral line lies on or near, for example, the optical axis of the projection system and/or the geometric center of the cross-sectional shape of the space 11 which is co-planar with the surface of the substrate and/or substrate table.

In an embodiment, the openings are arranged on a plurality of spiral lines having a common origin. The common origin is located in the space, desirably on or near, for example, the optical axis of the projection system and/or the geometric center of the space in a plane co-planar with the substrate and/or substrate table. In an embodiment the openings are arranged such that the locations of the openings in polar coordinates (r, θ) about an origin n is given by the following formulae:

$$R = c\sqrt{n+b}$$

$$\theta = n \times 137.5°$$

where b and c are constant. The origin is in the space, desirably on or near the optical axis of the projection system and/or the geometric center of the cross-sectional shape of the space 11 which is co-planar with the surface of the substrate W and/or substrate table WT.

In an embodiment, the openings in different rows or lines are of different sizes. In particular, the openings in outer rows or lines relative to the space are smaller than openings in inner rows or lines. In an embodiment, the openings 50 formed in a surface form a band. The band may be arranged around the origin and may form an annulus. The openings may be disposed in a band or annulus with a width in the range of 0.5 to 5 mm, desirably about 0.75 mm. (The width of the band may be the distance between the outer edge of the outer opening and the inner edge of the inner opening for example in a radial direction with respect to the origin). If the band is too wide, and/or too many openings are provided, the amount of gas from the environment that is extracted may become undesirably high. High extraction of gas may make it difficult to maintain a sufficient pressure drop across the openings. If the band is too narrow, and/or the number of openings too small, it is possible that insufficient liquid may be extracted and/or the meniscus pinning device may not accommodate sufficient movement of the meniscus.

Meniscus pinning devices may be in two general categories. A first type employs a porous structure with a large number of openings of order 10 µm to 20 µm in maximum cross-sectional dimension (e.g., diameter). This arrangement is effective to pin the meniscus but may be susceptible to contamination. It operates by extracting only liquid and therefore has small openings so that capillary forces prevent gas entering the small openings. Another type of meniscus pinning device employs a single line of large openings. This type of arrangement may be unlikely to be affected by contamination. However, when high scan speeds are employed with a meniscus pinning device with openings larger than 500 µm and a corresponding pitch, the meniscus may become undesirably concave between adjacent openings (i.e. with respect to the liquid rather than the gas associated with the meniscus). A significantly concave meniscus can allow the creation of large bubbles in the immersion liquid, particularly in the event that the meniscus collides with a droplet remaining on the substrate. The gas becomes entrapped in the liquid by being present between the meniscus of the droplet and the meniscus pinned by the openings of the meniscus pinning device at the moment of collision.

An embodiment with openings of an intermediate size and desirably multiple lines of openings, can minimize or reduce both sensitivity to contamination and creation of bubbles. In particular, any bubbles created in one or more embodiments of the invention are likely to be smaller and are more likely to be extracted to the meniscus opening device rather than drift into the projection beam. The meniscus pinning device may reduce the size of a bubble because a smaller volume of gas may be between the pinned meniscus and the droplet meniscus at collision. Therefore, the larger the radius of curvature of the pinned meniscus of a meniscus pinning device of an embodiment of the invention with respect to the radius of curvature of the droplet, the less likely a bubble is to form and/or the smaller the volume of the entrapped gas.

The meniscus can find its own stable position within the area covered by the meniscus pinning openings and therefore may be more stable than prior arrangements. Should the meniscus be dislodged from one opening it is easily held by another. An embodiment of the invention can operate most stably if at least one row or line of openings extracts only immersion liquid and at least one other row or line of openings extracts only gas. Another row or line can extract both liquid and gas simultaneously. In an embodiment, on the leading side of the liquid body the meniscus is likely to be pinned by openings near the inner side of the area covered by openings. The openings outward of the meniscus can serve to remove any droplet or film left on the substrate or substrate table during a previous scan or step. This reduces the chance of a bubble being created by collision between the meniscus and a droplet on the substrate.

Each of the openings 50 of the meniscus pinning device of FIG. 6 may be connected to a separate under pressure source. Alternatively or additionally, each or a plurality of the openings 50 may be connected to a common chamber (which may be annular) which is itself held at an under pressure. In this way a uniform under pressure at each or a plurality of the openings 50 may be achieved. The openings 50 can be connected to a vacuum source and/or the atmosphere surrounding the liquid supply system may be increased in pressure to generate the required under-pressure. It is desirable that the pressure drop across the openings is sufficiently high to minimize vibrations.

In an embodiment, openings 50 are formed by openings in a plate which is mounted on the fluid handling structure to cover a recess therein. The recess is connected to the under-pressure and can be annular. In an embodiment the openings in the plate are formed by laser drilling or etching after lithographically patterning an etch-resistant cover layer.

Each opening 50 is designed to extract a mixture of liquid and gas, for example in a two phase flow. The liquid is extracted from the space 11 whereas the gas is extracted from the atmosphere on the other side of the openings 50 to the liquid. This creates a gas flow as illustrated by arrows 100. This gas flow is effective to pin the meniscus 90 between the openings 50 substantially in place as illustrated in FIG. 6, for example between neighboring openings 50. The gas flow helps maintain the liquid confined by momentum blocking, by a gas flow induced pressure gradient and/or by drag (shear) of the gas flow on the liquid. In an embodiment, the openings 50 are provided in a surface. It is desirable that that surface is lyophilic to the immersion liquid (i.e. hydrophilic if the immersion liquid is water). In such an embodiment, a transition, when the meniscus moves from one opening to another, is smooth. The ingress of the immersion liquid to the opening may be better. In an embodiment, the position of the substrate table and/or the fluid handling structure 12 is controlled so that the distance between the surface and the substrate or substrate table is in the range of from 130 to 180 μm.

As can be seen from FIG. 6, the openings 50 are positioned so as to form, in plan, a polygonal shape. In the case of FIG. 6 this is in the shape of a rhombus with the principal axes 110, 120 aligned with the major directions of travel of the substrate W under the projection system PS. This helps ensure that the maximum scan speed is faster than if the openings 50 were arranged in a circular shape, for example below a meniscus critical scan speed above which the meniscus may become unstable. This is because the force on the meniscus between two openings 50 is reduced with a factor cos θ, where θ is the angle of the line connecting the two openings 50 relative to the direction in which the substrate W is moving. Thus, throughput can be optimized by having the primary axis 110 of the shape of the openings 50 aligned with the major direction of travel of the substrate (usually the scan direction) and to have a second axis 120 aligned with the other major direction of travel of the substrate (usually the step direction).

It will be appreciated that any arrangement in which θ is different to 90° will give an advantage. Thus, exact alignment of the principal axes with the major directions of travel is not vital. It will further be appreciated that if the shape is circular, then there will always be two openings 50 which are aligned perpendicularly to the direction of travel so that the meniscus between those two outlets receives the maximum available force by movement of the substrate W. From the above, it can be seen that even the use of a square shape with the sides aligned at about 45° to the principal directions of travel of the substrate gives a great benefit. However, an embodiment can have openings 50 that make any shape in plan, for example a circle.

Radially outward of the openings may be a gas knife opening through which a gas flow may be supplied during operation. Such as arrangement is described in United States patent application publication no. US 2010-0313974, which is hereby incorporated by reference in its entirety.

Further details of the openings 50 and the fluid handling structure 12 can be found in United States patent application publication no. US 2008/0212046 which is hereby incorporated by reference in its entirety.

Formed in the undersurface is one or more further (supply) openings 70 which are configured to outlet fluid (e.g. liquid, such as immersion liquid) from the fluid handling structure 12. The further opening 70 may be considered as inletting liquid into the space 11. The supply opening 70 is radially inwardly, with respect to the optical axis of the projection system PS, of the extraction openings 50. The liquid exiting the opening 70 of the fluid handling system 12 is directed towards the substrate W. This type of opening 70 is provided in order to reduce the chances of bubbles being generated in the immersion liquid. Gas may become trapped in a gap between the edge of the substrate W and the substrate table WT. At an advancing part of the undersurface of the fluid handling structure 12, the fluid handling structure may be moving sufficiently fast relative to the facing surface of the substrate W such that liquid is unable to flow from the space 11 to the openings 50. A portion of the undersurface of the fluid handing structure 12 between the edge 20 and the openings 50 may become de-wetted, affecting the effectiveness of the meniscus pinning of the openings 50. Supplying liquid through the further opening 70, desirably near the openings 50, thereby reduces the risk of bubble inclusion and de-wetting.

The geometry of the opening 70 has an impact upon the effectiveness of the fluid handling structure 12 in containing liquid. In particular, it is desirable that the supply opening 70 has a shape, in plan which is cornered, like the shape of the openings 50, in plan. Indeed, the cornered shapes of the opening 70 and openings 50 are desirably substantially similar. In an embodiment, each shape has, at the apex of each corner 52 an opening 70 or opening 50. Desirably the opening 70 is within 10 mm, desirably 5 mm of an opening 50. That is, all parts of the shape made by the openings 50 are within 10 mm of a part of the shape made by the opening 70.

Further details regarding the extraction openings 50 and further supply openings 70 may be found in United States patent application publication no. US 2009-0279060, which is hereby incorporated by reference in its entirety.

Figure 7:
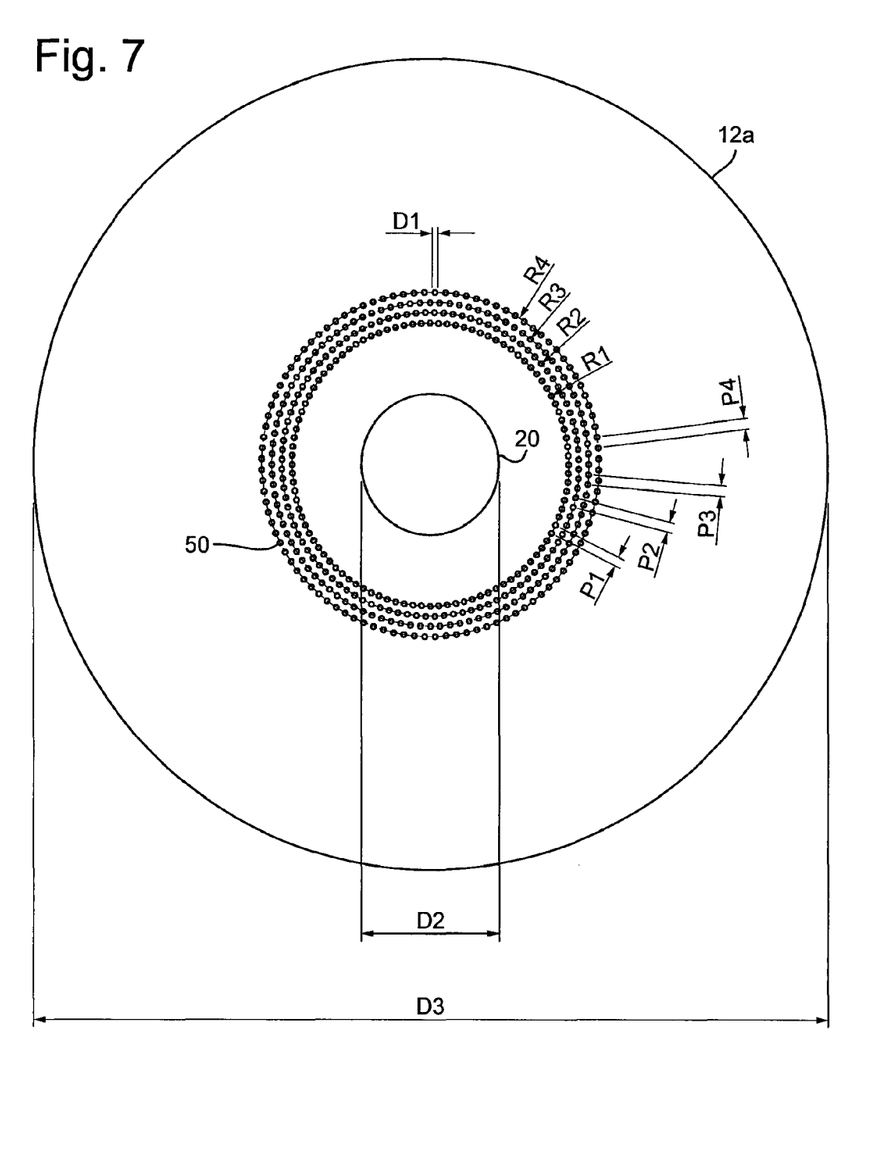
FIG. 7 depicts, in plan, a part of a fluid handling structure according to an embodiment of the invention.

FIG. 7 illustrates, in plan, a plate that is a test plate. In an embodiment the features present in the plate may form one or more features of the underside of a fluid handling structure (e.g. a liquid confinement structure) 12. The plate 12a may have an overall maximum cross-sectional dimension (e.g., diameter) D3 of about 200 mm and a central opening 20 with a maximum cross-sectional dimension (e.g., diameter) D2 of about 35 mm. The plate 12a is provided with four concentric rings of openings 50 to form a meniscus pinning device. Each of openings 50 has a maximum cross-sectional dimension (e.g., diameter) D1 of about 125 μm. The rings of openings 50 may have, for example, radii R1 to R4 of respectively about 35 mm, 37.5 mm, 40 mm and 42.5 mm. The pitches P1 to P4 of the openings 50 of the respective rings may be about 220 μm, 240 μm, 250 μm and 270 μm respectively. Note that in FIG. 7 the openings 50 and the pitch between them are not shown to scale.

Figure 8:
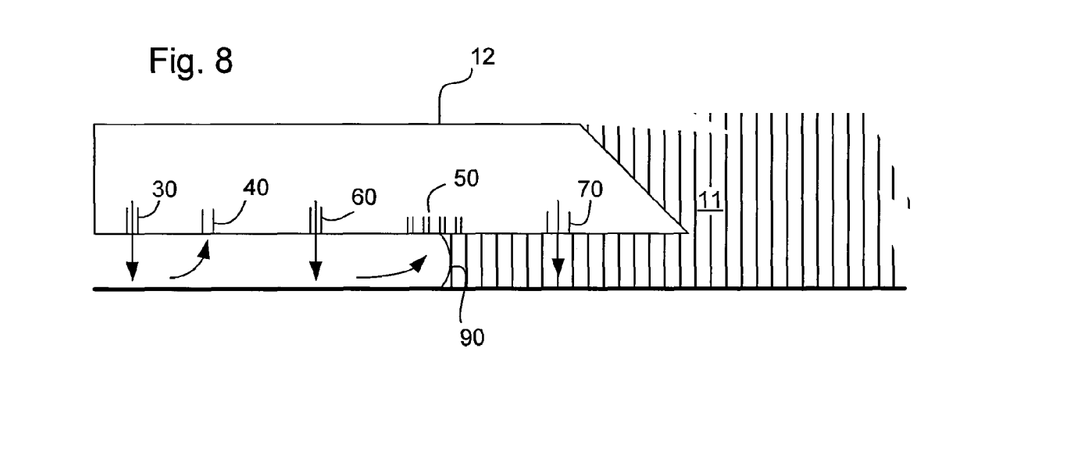
FIG. 8 depicts, in cross section, a part of a fluid handling structure according to an embodiment of the invention.

FIG. 8 shows, in cross-section, a part of a fluid handling structure embodying a meniscus pinning device of an embodiment of the present invention. The depicted fluid handling structure has radially arranged openings formed in its undersurface. The openings 50 may form a plurality of rings (which may be circular and may be arranged concentrically). Radially inwardly of the concentric rings of openings 50 (which form the meniscus pinning device) are one or more openings 70 which may be in the form of a ring around the space 11. The opening 70 forms a liquid supply to the gap between fluid handling structure 12 and the facing surface of the substrate table and/or substrate W.

Radially outward of the meniscus pinning device are openings 30 and 60 which may be in the form of concentric slits. Gas at high pressure may be provided through each concentric slit to form a gas knife. The gas knives may serve one or more purposes. The radially inward gas knife of opening 60 serves to facilitate the pinning of liquid by the openings of the meniscus pinning device and to help prevent a liquid droplet from escaping radially outwards from the space. The radially inward gas knife 60 may serve to prevent a droplet radially outward of the opening 60 from reaching and colliding with the meniscus 90. The radially outward gas knife opening 30 helps to prevent liquid remaining on the substrate from colliding with meniscus 90, by helping to prevent liquid on the surface facing the underside of the fluid handling structure 12 radially outward of the opening 30 from reaching the meniscus 90. Between gas knife openings 30 and 60, an extraction opening 40 is provided through which gas and any liquid swept up from the substrate W is extracted. The gas from the radially outward gas knife 60 may assist the extraction through the extraction opening 40. The function of this arrangement is described in further detail in U.S. patent application no. U.S. 61/266,058, filed on 2 Dec. 2009, which is hereby incorporated by reference in its entirety.

Figure 9:
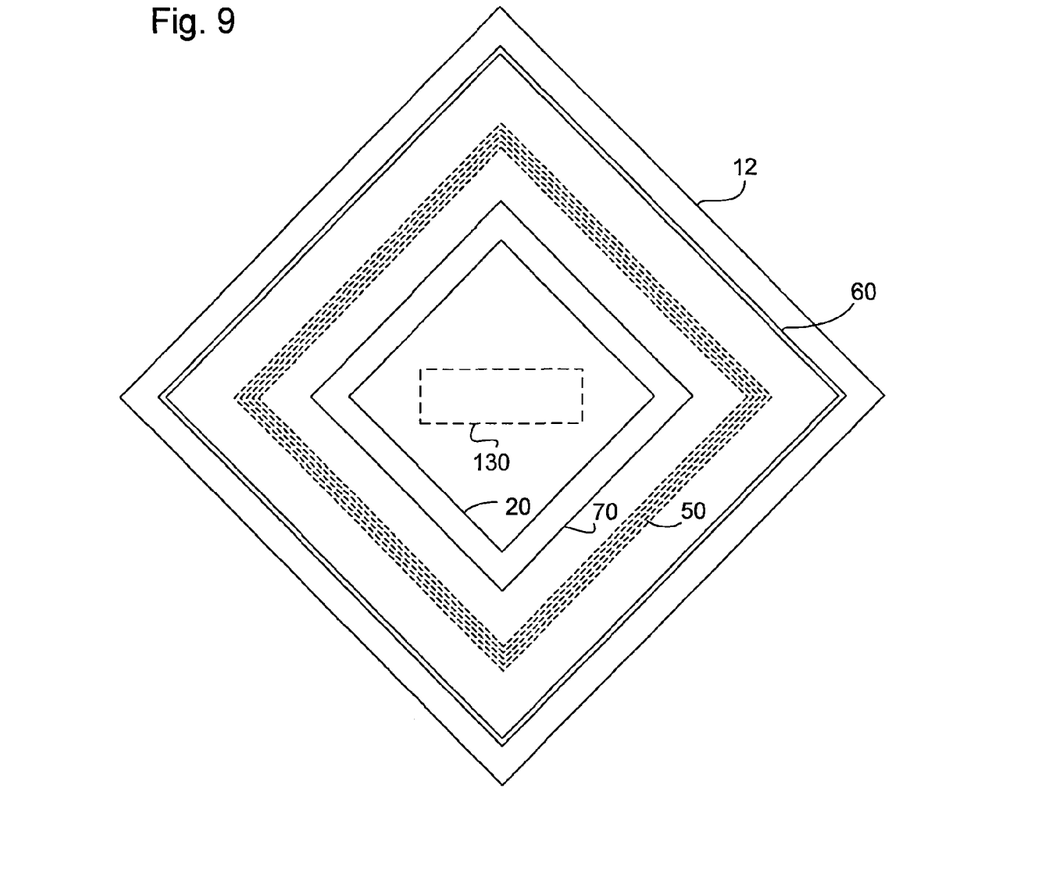
FIG. 9 depicts, in plan, a part of a fluid handling structure according to an embodiment of the invention.

FIG. 9 shows, in plan, the underside of a fluid handling structure 12 of a further embodiment of the invention. In this embodiment a single gas knife 60 is provided outside the meniscus pinning device formed by openings 50. The gas knife 60 shown in FIG. 9 may have a similar purpose to the opening 60 shown in FIG. 8. The gas knife slit 60, meniscus pinning openings 50 and liquid supply opening 70 as well as central opening 20 of the fluid handling structure 12 are all rhombic (e.g., diamond-shaped) in plan. The function of this arrangement is described in further detail in United States patent application publication no. US 2010-0313974, which is hereby incorporated by reference in its entirety.

In a fluid handling structure according to an embodiment of the invention, the meniscus pinning device may be around or at least partly around the or geometric center of a planar cross-section of the fluid handling structure, for example at a corner of the shape of the undersurface of the fluid handling structure.

Figure 10:
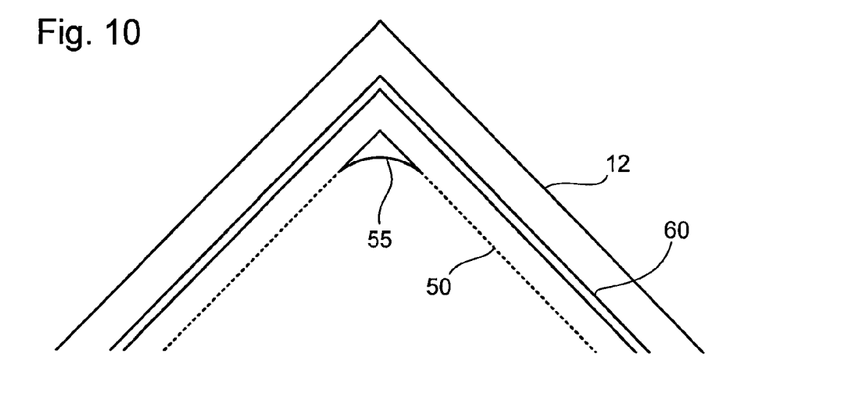
FIG. 10 depicts, in plan, a part of a fluid handling structure according to an embodiment of the invention.

FIG. 10 is an enlargement of a leading or trailing corner of a fluid handling structure 12 similar to that shown in FIG. 9 but according to a further embodiment of the invention. In an embodiment, meniscus pinning openings 50 are provided in two straight or curved lines meeting at a corner. The main meniscus pinning openings 50 (for example between corners) may be large openings as used in prior arrangement or may be intermediate sized openings as described above. A corner piece 55 is provided at the corner where the two lines of meniscus pinning openings 50 meet. The corner piece has two radially outer edges which may be aligned with the two lines of meniscus pinning openings 50. A radially inner edge 56 (see FIGS. 11 and 12) of the corner piece defines the inner side of the corner piece and together with the two radially outer edges defines the surface of the corner piece 55. Openings 51 (see FIGS. 11 and 12) may be formed in the surface of the corner piece 55 in an irregular pattern, in a series of linear or even curved linear arrays. The openings 51 may form a linear array of openings through the corner piece 55. The inner edge 56 may be curved, with a positive radius of curvature with respect to the geometric center of the undersurface of the fluid handling structure 12.

Figure 11:
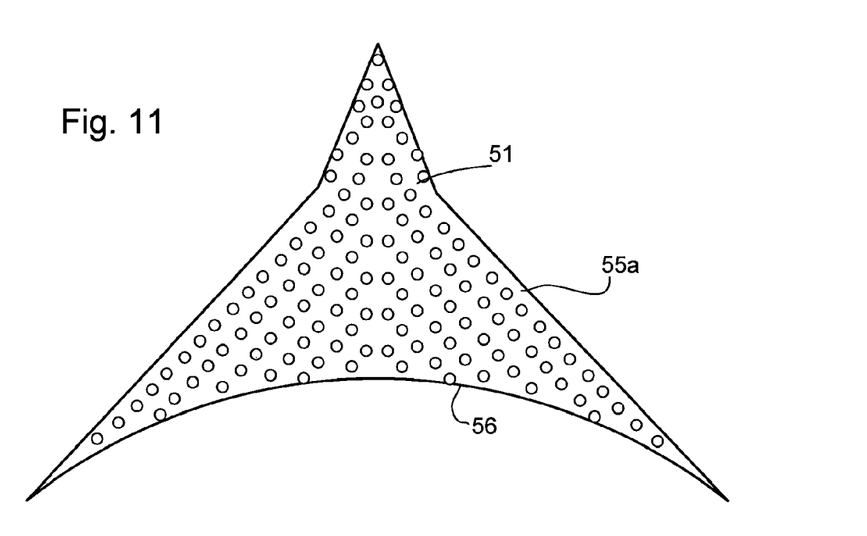
FIG. 11 depicts a corner piece useable in a fluid handling structure according to an embodiment of the invention.
Figure 12:
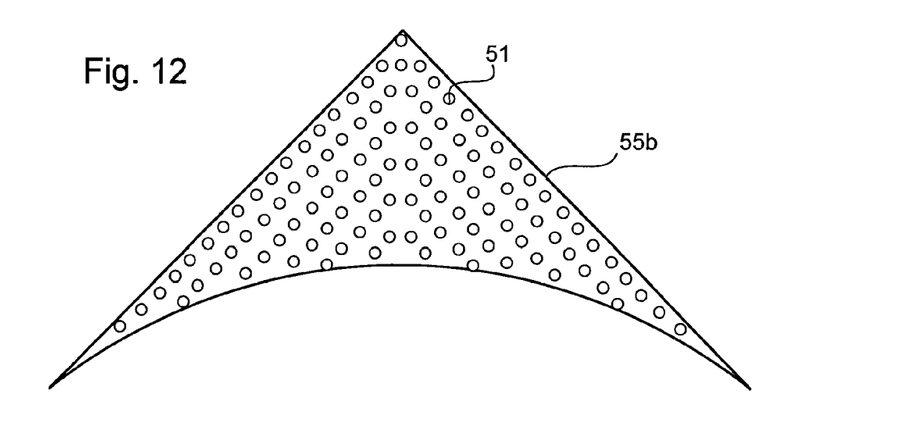
FIG. 12 depicts another corner piece useable in a fluid handling structure according to an embodiment of the invention.

One example of a corner piece 55a is shown in FIG. 11. The corner piece 55a comprises an arrangement of openings 51 of intermediate size as discussed above. As can be seen from FIG. 11, the arrangement of intermediate-sized openings 51 extends a little beyond the continuation of the lines of openings 50 so as to form a sharper point to the meniscus pinning device. The angle of the corner of the corner piece 55 can be in the range of 60° to 80°. A side of the corner piece may be curved. In an arrangement, shown in FIG. 12, the corner piece 55b conforms to the shape of the continued lines of meniscus pinning openings 50.

In an embodiment, there is provided a lithographic apparatus comprising: a table configured to hold a substrate; a projection system configured to project an image onto the substrate while the table and the projection system are moved relative to each other; and a liquid confinement structure arranged to confine a liquid to a space between the projection system and the substrate and/or table, the liquid confinement structure having a meniscus pinning device arranged to pin a meniscus of the liquid, the meniscus pinning device comprising a plurality of openings arranged in use to be connected to an under-pressure, the openings having a maximum cross-sectional dimension in the range of from 75 μm to 150 μm.

In an embodiment, the meniscus pinning device is configured to extract both liquid and gas when connected to the under-pressure.

In an embodiment, the openings have a maximum cross-sectional dimension in the range of from about 100 μm to 125 μm.

In an embodiment, the openings are arranged on a plurality of concentric imaginary lines surrounding the space.

In an embodiment, the number of the concentric imaginary lines is in the range of from 1 to 10, desirably in the range of from 3 to 5.

In an embodiment, the openings are arranged in a plurality of rows.

In an embodiment, the number of rows is in the range of from 1 to 10, desirably in the range of from 3 to 5.

In an embodiment, at least one of the rows forms a closed loop around the space.

In an embodiment, the openings are spaced apart and have a center to center distance in the range of from about 100 μm to about 500 μm, desirably from about 200 μm to 300 μm.

In an embodiment, the openings are arranged in a regular array.

In an embodiment, the openings are irregularly arranged.

In an embodiment, the openings are provided at a corner of the meniscus pinning device that leads or trails during relative motion between the liquid confinement structure and the substrate and/or table.

In an embodiment, the liquid confinement structure has a surface which defines the openings.

In an embodiment, the maximum cross-sectional dimension is a diameter.

In an embodiment, there is provided a device manufacturing method using a lithographic apparatus, the method comprising: confining a body of liquid to a space in contact with the surface of a substrate, the confining comprising pinning a meniscus of the body of liquid by extracting liquid and gas from the environment through a plurality of openings, the openings having a maximum cross-sectional dimension in the range of from 75 μm to 150 μm; and projecting an image onto the substrate through the body of liquid while moving the substrate in a scanning direction.

In an embodiment, the openings are arranged in a plurality of concentric imaginary lines surrounding the space.

In an embodiment, the extracting comprises extracting both liquid and gas simultaneously through the openings.

In an embodiment, the maximum cross-sectional dimension is a diameter.

In an embodiment, there is provided a fluid handling structure for an immersion lithographic apparatus, the fluid handling structure comprising a two dimensional pattern of two phase fluid extraction openings configured to pin a meniscus of immersion liquid confined to a space, wherein the meniscus is pinned to a pinning opening in a linear array of openings of the two dimensional pattern substantially perpendicular to the meniscus.

In an embodiment, when the meniscus is advancing and/or static relative to the space, in a radial direction with respect to a geometric center of the undersurface of the fluid handling structure, the pinning opening is an opening in the linear array closest to the space and/or geometric center.

In an embodiment, the two dimensional pattern of openings is located radially around at least part of the space.

In an embodiment, the fluid handling structure has, in plan, a shape with a corner, the two dimensional array of openings being located at least at the corner.

In an embodiment, the fluid handling structure is configured to supply and to confine immersion liquid to the space, the space being defined between a projection system of the immersion lithographic apparatus and a facing surface facing the projection system, the facing surface comprising a table, a substrate, or both the table and the substrate.

In an embodiment, the two dimensional pattern is a two dimensional array.

In an embodiment, the linear array is at least partly curved.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media. The controllers described above may have any suitable configuration for receiving, processing, and sending signals. For example, each controller may include one or more processors for executing the computer programs that include machine-readable instructions for the methods described above. The controllers may include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

Moreover, although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. Thus, it is intended that the scope of the present invention herein disclosed should not be limited by the particular disclosed embodiments described above, but should be determined only by a fair reading of the claims that follow. The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a table configured to hold a substrate;
   a projection system configured to project an image onto the substrate while the table and the projection system are moved relative to each other; and
   a liquid confinement structure arranged to confine a liquid to a space between the projection system and the substrate and/or table, the liquid confinement structure having a meniscus pinning device arranged to pin a meniscus of the liquid, the meniscus pinning device comprising a plurality of openings arranged in use to be connected to an under-pressure, the openings having a maximum cross-sectional dimension in the range of from 75 μm to 150 μm.

2. The lithographic apparatus according to claim 1, wherein the meniscus pinning device is configured to extract both liquid and gas when connected to the under-pressure.

3. The lithographic apparatus according to claim 1, wherein the openings have a maximum cross-sectional dimension in the range of from about 100 μm to 125 μm.

4. The lithographic apparatus according to claim 1, wherein the openings are arranged on a plurality of concentric imaginary lines surrounding the space.

5. The lithographic apparatus according to claim 1, wherein the openings are arranged in a plurality of rows, the number of rows being in the range of from 2 to 10.

6. The lithographic apparatus according to claim 5, wherein at least one of the rows forms a closed loop around the space.

7. The lithographic apparatus according to claim 1, wherein the openings are spaced apart and have a center to center distance in the range of from about 100 µm to about 500 µm.

8. The lithographic apparatus according to claim 1, wherein the openings are arranged in a regular array.

9. The lithographic apparatus according to claim 8, wherein the openings are provided at a corner of the meniscus pinning device that leads or trails during relative motion between the liquid confinement structure and the substrate and/or table.

10. The lithographic apparatus according to claim 1, wherein the openings are irregularly arranged.

11. The lithographic apparatus according to claim 1, wherein the maximum cross-sectional dimension is a diameter.

12. The fluid handling structure of claim 1, wherein the openings comprises a first line of five or more of the openings and a second line of five or more of the openings, the second line being radially outward with respect to a geometric center of the undersurface of the fluid handling structure of the first line.

13. A device manufacturing method using a lithographic apparatus, the method comprising:
confining a body of liquid to a space in contact with the surface of a substrate, the confining comprising pinning a meniscus of the body of liquid by extracting liquid and gas from the environment through a plurality of openings, the openings having a maximum cross-sectional dimension in the range of from 75 µm to 150 µm; and
projecting an image onto the substrate through the body of liquid while moving the substrate in a scanning direction.

14. The method according to claim 13, wherein the openings are arranged in a plurality of concentric imaginary lines surrounding the space.

15. The method according to claim 13, wherein the extracting comprises extracting both liquid and gas simultaneously through the openings.

16. A fluid handling structure for an immersion lithographic apparatus, the fluid handling structure comprising a two dimensional pattern of two phase fluid extraction openings configured to pin a meniscus of immersion liquid confined to a space, the openings comprising a first line of three or more of the openings arranged at a first pitch and a second line of three or more of the openings arranged at a second pitch different than the first pitch, the second line being radially outward with respect to a geometric center of the undersurface of the fluid handling structure of the first line, wherein the meniscus is pinned to a pinning opening in a linear array of the openings traversing the first and second lines, the linear array substantially perpendicular to the meniscus and extending generally in a radial direction from the geometric center.

17. The fluid handling structure of claim 16, wherein, when the meniscus is advancing and/or static relative to the space, in the radial direction with respect to the geometric center of the undersurface of the fluid handling structure, the pinning opening is an opening in the linear array closest to the space and/or geometric center.

18. The fluid handling structure of claim 16, having, in plan, a shape with a corner, the two dimensional array of openings is located at least at the corner.

19. The fluid handling structure of claim 16, configured to supply and to confine immersion liquid to the space, the space being defined between a projection system of the immersion lithographic apparatus and a facing surface facing the projection system, the facing surface comprising a table, a substrate, or both the table and the substrate.

20. The fluid handling structure of claim 16, wherein the openings having a maximum cross-sectional dimension in the range of from 75 µm to 150 µm.

21. A fluid handling structure for an immersion lithographic apparatus, the fluid handling structure comprising a two dimensional pattern of two phase fluid extraction openings configured to pin a meniscus of immersion liquid confined to a space, the openings comprising a first line of five or more of the openings having a first opening cross-sectional dimension and a second line of five or more of the openings having a second opening cross-sectional dimension different than the first cross-sectional dimension, the second line being radially outward with respect to a geometric center of the undersurface of the fluid handling structure of the first line, wherein the meniscus is pinned to a pinning opening in a linear array of the openings traversing the first and second lines, the linear array substantially perpendicular to the meniscus and extending generally in a radial direction from the geometric center.

22. The fluid handling structure of claim 21, wherein the openings having a maximum cross-sectional dimension in the range of from 75 µm to 150 µm.

* * * * *